(12) United States Patent
Carton et al.

(10) Patent No.: US 6,194,901 B1
(45) Date of Patent: Feb. 27, 2001

(54) MEASURING CIRCUIT FOR A SYSTEM OF ELECTRICAL MODULES CONNECTED IN SERIES

(75) Inventors: Jean-Luc Carton, Bures sur Yvette; Christophe Morin, Blanchefort; Michel Perelle, Parcay-Meslay; Régis Equoy, St Medard en Jalles, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/453,523

(22) Filed: Dec. 3, 1999

(30) Foreign Application Priority Data

Jan. 7, 1999 (FR) .................................................. 99 00089

(51) Int. Cl.[7] .................................................. G01N 27/416
(52) U.S. Cl. .......................................... 324/434; 324/426
(58) Field of Search ............................................... 324/434

(56) References Cited

U.S. PATENT DOCUMENTS

| | | | |
|---|---|---|---|
| 5,479,085 | * | 12/1995 | Honda et al. ......................... 320/134 |
| 5,545,969 | * | 8/1996 | Hasegawa ............................. 324/434 |
| 5,578,927 | | 11/1996 | Perelle .................................. 324/434 |
| 5,602,481 | * | 2/1997 | Fukuyama ............................. 492/120 |
| 6,091,246 | * | 7/2000 | Saigo et al. ........................... 324/434 |

FOREIGN PATENT DOCUMENTS 8-136630 5/1996 (JP) .

* cited by examiner

Primary Examiner—Peter S. Wong
Assistant Examiner—Pia Tibbits
(74) Attorney, Agent, or Firm—Sughrue, Mion, Zinn, Macpeak & Seas, PLLC

(57) ABSTRACT

A measurement circuit for a system of electrical modules in series with which are associated individual measurement interfaces and a measurement transducer to which the interfaces successively supply their measurement signals via a first serial link in response to interface selection pulses from a common logic unit transmitted serially from one interface to the next via a link. Each measurement signal is transmitted to the transducer either directly for the one closest to the transducer or via one or more interfaces which are not selected and which it crosses, depending on the position within the sequence of interfaces of the interface which produced it. To this end a routing unit, a measurement signal generator and a bypass are associated with each other in each interface. Protective diodes are connected in series in the link elements between the interfaces of two successive modules.

3 Claims, 1 Drawing Sheet

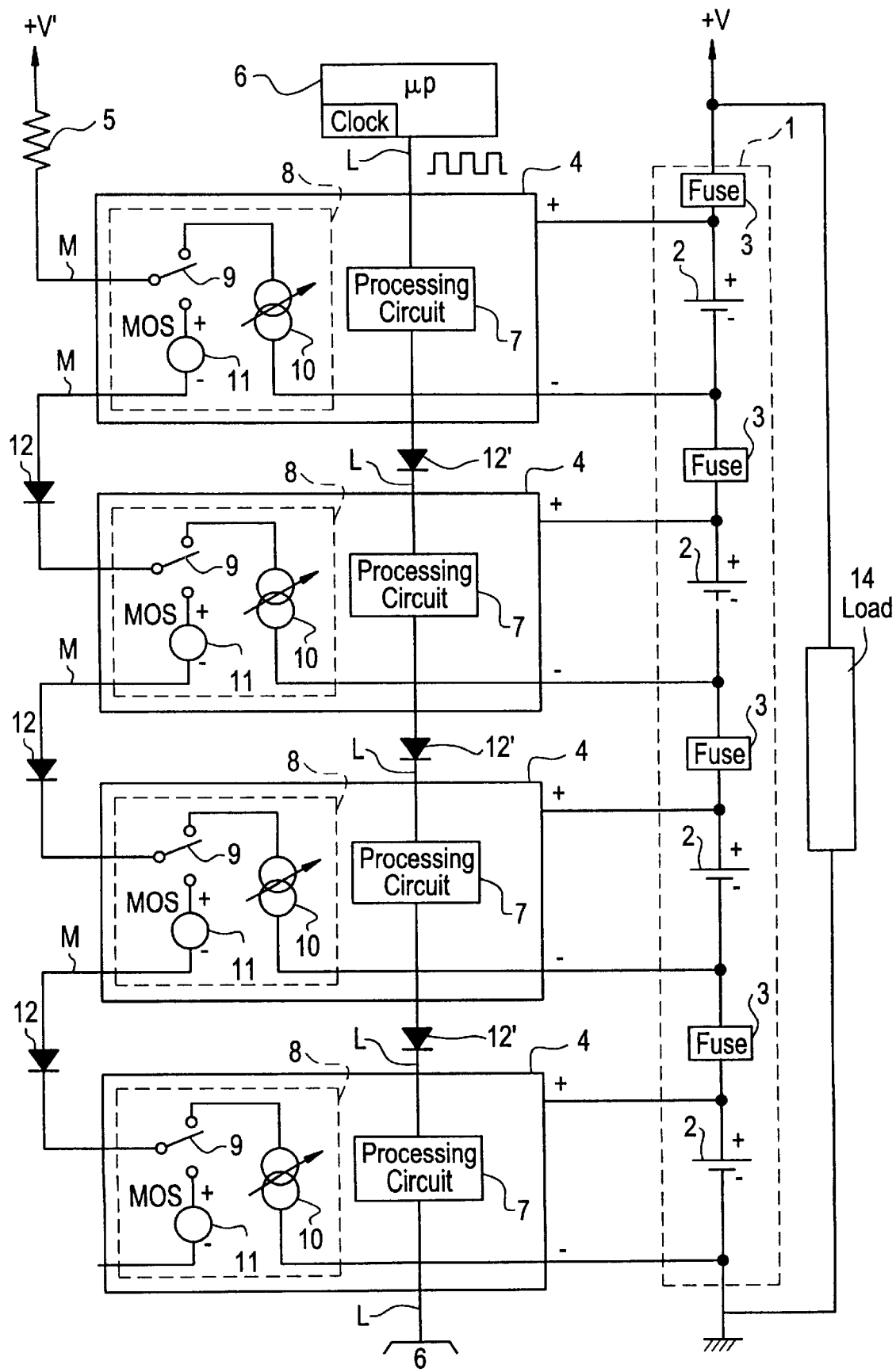

MEASURING CIRCUIT FOR A SYSTEM OF ELECTRICAL MODULES CONNECTED IN SERIES

BACKGROUND OF THE INVENTION

1. Field of the Invention

The invention concerns a measuring circuit for a modular system of electrical modules connected in series and in particular for a system of modules each consisting of one or more elements for producing, storing or converting electrical energy. It is more particularly concerned with systems comprising multiple modules operating at a high voltage.

2. Description of the Prior Art

The operation of systems of electrical modules connected in series can be largely optimized, in particular when the number of modules is relatively large, if it is possible to monitor the operation of each module accurately and consequently to carry out measurements module by module.

U.S. Pat. No. 5,638,002 describes a measuring circuit for such systems of modules. It provides accurate measurements and reduces the number of electrical connections needed to transmit measurement signals. A first serial link connects measurement interfaces individually assigned to the modules and enables a common transducer to handle successively measurement signals obtained by means of current generators at the interfaces. A second serial link transmits individual selection pulses to the interfaces from a common logic unit.

In some cases it is beneficial to have a high voltage at the terminals of a system of modules, for example to drive the motor in an electric vehicle. This has repercussions in terms of the interfaces of the measurement circuit for a system of modules of this kind, in that the interface components may be required to withstand a high voltage, possibly as high as the voltage at the terminals of the system, and malfunctions that can occur during operation of the system of modules can lead to the occurrence of abnormal voltages and in particular reverse voltages at the input/output terminals of the interfaces.

SUMMARY OF THE INVENTION

The invention therefore proposes a measurement circuit for a modular system of modules electrically connected in series, each consisting of one or more elements for producing, storing or converting electrical energy, and with which are associated individual measurement interfaces for each module and a measurement signal transducer to which the interfaces successively supply their measurement signals via a first serial link in response to individual interface selection pulses transmitted from a common logic unit via a second serial link, wherein the successive interfaces are interconnected by elements of the first and second links, at least two interfaces corresponding to two successive modules being connected by two link elements, one of which is a first link element and the other of which is a second link element, each incorporating a protective diode connected in series to protect against a reverse voltage, in particular in the event of a break in the electrical continuity between the modules to which the interfaces between which the diodes are connected correspond.

The invention also proposes a measurement circuit for a modular system of modules electrically connected in series, each comprising one or more elements for producing, storing or converting electrical energy, and with which are associated individual measurement interfaces for each module and a measurement signal transducer to which the interfaces successively transmit, via a serial first link, current measurement signals that they respectively produce in response to individual interface selection pulses transmitted from a common logic unit, each interface including a selection pulse processing circuit by means of which it is selected, in which circuit, in which the successive interfaces are interconnected by elements of the first link, each interface includes a device which associates a routing unit controlled by the selection pulse processing circuit with an analog measurement signal generator and a bypass, the routing unit alternately putting the analog measurement signal generator and the common measurement signal transducer into communication via the first link when the interface is selected and the bypass and the measurement signal transducer into communication via the first link when the interface is not selected, the bypass then assuring integral transmission of an analog measurement signal via the interface to the transducer when the signal is received from another interface upstream of the bypass on the first link relative to the transducer.

According to one feature of the invention a second serial link transmits individual interface selection pulses transmitted by the common logic unit, the first and second links are respectively made up of elements inserted between two interfaces corresponding to two successive modules, and at least two interfaces corresponding to two successive modules are connected by two link elements, one of which is a first link element and the other of which is a second link element, each incorporating a protective diode connected in series to protect against reverse voltage, in particular in the event of a break in the electrical continuity between the modules to which the interfaces between which the diodes are connected correspond.

The invention, its features and its advantages are explained in the following description, which is given with reference to the accompanying drawing.

BRIEF DESCRIPTION OF THE DRAWING

The single FIGURE of the accompanying drawing is a theoretical circuit diagram of a modular system of electrical modules in the form of storage batteries associated with a measurement circuit in accordance with the invention.

DETAILED DESCRIPTION OF THE PREFERRED EMBODIMENT

The measurement circuit shown in the single FIGURE is designed to be associated with a modular electrical system 1 made up of a plurality of modules 2 connected in series at power transmission terminals, each module conventionally having two terminals denoted "+" and "−". Each module is made up of a plurality of elements which produce, convert or store electrical energy, for example, which elements include storage cells, storage batteries and supercapacitors. The system 1 shown is made up of electrical modules 2 in the form of storage batteries. For example, it is an electric vehicle motor power supply system made up of 12 volt batteries connected in series to provide a DC operating voltage of several hundred volts. For safety reasons, and because high currents can be produced in a system of this kind, there is at least one device 3 such as a protective fuse and/or an interrupter device between at least two modules of the system, for example between the two modules in the middle of the series formed by the series-connected modules.

The measurement circuit of the invention collects information relating to the operation of the modules 2 of the system 1 and determines the value of the DC voltage at the terminals of each module, for example. It includes individual measurement interfaces 4 for each module of the system with which it is associated. The measurement signals obtained at the interfaces 4 are successively transmitted to a common analog or digital measurement signal transducer 5 via a serial link M made up of successive elements between which the interfaces are inserted. The transmission of the signals is governed by a logic unit 6 which sends streams of individual interface selection pulses over a serial link L also made up of successive elements between which the interfaces are inserted.

In the embodiment shown here, the selection pulses from the logic unit 6 are successively transmitted from one interface to the next via the elements forming the link L. Each interface includes a selection pulse processing circuit 7 which takes account of the first selection pulse of a stream it receives from the logic unit 6. Other selection pulses received by the processing circuit 7 of an interface in a stream of pulses are transmitted by that circuit via the link L to the processing circuit of the next interface.

The processing circuits 7 of the interfaces are not described in more detail because they are well known in the art, one example being described in the previously mentioned U.S. Pat. No. 5,638,002.

The selection pulse processing circuit 7 of an interface 4 controls the supply of the measurement signal produced by the interface to the measurement signal transducer 5 when it has received an individual selection pulse to that effect. The signal is deemed to be an analog signal in the remainder of the description. It could be a digital signal supplied to the measurement transducer, which would then itself be digital, and based on a measurement performed at a module via the interface assigned to that module. The logic unit 6 is connected to the measurement signal transducer in a manner that can be conventional, and is not shown, in order to take account of the measurement signals obtained, the logic unit using programed logic based on a processor with associated memories and a clock, for example, in the conventional manner.

In the embodiment shown, the selection pulse processing circuit 7 operates on an MOS routing unit 9 of a device 8 and the routing unit is associated with a measurement signal generator 10 and an MOS bypass 11.

The routing unit 9 of a module interface comprises two MOS transistors, for example. The transistors are controlled so that the measurement signal generator 10 communicates with the measurement signal transducer 5 of the circuit via the link M when the interface of the module in question is selected and the bypass 11 communicates with the measurement signal transducer 5 via the same link M when the interface is not selected.

The bypass 11 provides integral transmission of a measurement signal via the interface to the measurement signal transducer 5 when the interface is not selected and the signal it has received comes from another interface which is upstream of it on the first link, relative to the transducer. The routing unit 9 of the interface then connects the two elements of the link M between which the interface is inserted.

In the embodiment shown here, each device 8 includes a measurement signal generator 10 in the form of an analog current generator. The generator modifies the current flowing in the measurement signal transducer 5 via the link M. The measurement signal generator 10 of a selected interface 4 modifies the current as a function of a measurement performed at the interface, for example as a function of the voltage at the terminals of the module to which the selected interface is assigned.

In the embodiment shown, the current produced by a measurement signal generator 10 of an interface as a function of a measurement that has been effected is applied to the resistor constituting the measurement signal transducer 5 when the interface is selected by a pulse and the element 8 of the interface routes the measurement signal that the current constitutes to the resistor forming the transducer 5. The measurement signal then passes through the elements of the link M and the routing units 9 and bypasses 11 of the interfaces between the selected interface and the measurement transducer 5.

The bypasses 11 of the non-selected interfaces are then switched into the line by the respective routing units associated with them in the interfaces. They assure integral transmission of the analog measurement signal passing through the interfaces incorporating them. In the embodiment described, the resistor forming the measurement transducer 5 is connected to a potential V' slightly higher than the positive potential V of the system 1 in the case where the analog measurement signal is supplied by the immediately upstream interface.

According to the invention, a protection diode 12 is inserted into at least one element of the link M to prevent the application of a high reverse voltage to the interfaces via the link in the event of a break in the electrical continuity between the modules 2 of the system 1. When the system 1 is operating, it is associated with a load 14 which in some applications has a low internal resistance, in particular if the load is an electric motor. Accordingly, the voltage which appears in the event of intentional or accidental breaking of the continuity between the modules 2 is a reverse voltage and can be too high for the interfaces to withstand in the absence of the protective diode. This reverse voltage can correspond to the nominal voltage of the system 1, i.e. it can be several hundred volts.

For a similar reason, a protective diode 12' is also provided in the link element L connecting the same interfaces as a link element M incorporating a protective diode 12.

In the example shown in the single FIGURE, there are protective diodes 12 and 12' in all the link elements L and M connecting two interfaces, although of course the diodes could be provided alternately in the interfaces with which they are associated. Protective diodes 12 and 12' could instead be provided for a group of interfaces with a minimum of one diode per link L, M if the reverse voltage that may occur allows this. One such limiting case occurs if the series-connected modules 2 of a system 1 are divided into two sub-systems each corresponding to a bank of storage batteries, for example, and a device 3 including a fuse and/or a disconnector is provided between the two sub-systems. The diodes 12 and 12' are then inserted between the two interfaces 4 which are assigned to the modules 2 each belonging to a different sub-system between which the device 11 is located. Other variants are feasible, of course.

The interfaces 4 described here are of the kind described in U.S. Pat. Nos. 5,578,927 and 5,638,002. The measurement generator 10 of each interface is based on a circuit for measuring the voltage at the terminals of the module to which the interface is assigned, for example.

There is claimed:

1. A measurement circuit for a modular system of modules electrically connected in series, each consisting of one or more elements for producing, storing or converting electrical energy, and with which are associated individual measurement interfaces for each module and a measurement signal transducer to which the interfaces successively supply their measurement signals via a first serial link in response to individual interface selection pulses transmitted from a common logic unit via a second serial link, wherein said successive interfaces are interconnected by elements of said first and second links, at least two interfaces corresponding to two successive modules being connected by two link elements, one of which is a first link element and the other of which is a second link element, each incorporating a protective diode connected in series to protect against a reverse voltage, in particular in the event of a break in the electrical continuity between the modules to which the interfaces between which said diodes are connected correspond.

2. A measurement circuit for a modular system of modules electrically connected in series, each comprising one or more elements for producing, storing or converting electrical energy, and with which are associated individual measurement interfaces for each module and a measurement signal transducer to which the interfaces successively transmit, via a serial first link, current measurement signals that they respectively produce in response to individual interface selection pulses transmitted from a common logic unit, each interface including a selection pulse processing circuit by means of which it is selected, in which circuit, in which the successive interfaces are interconnected by elements of said first link, each interface includes a device which associates a routing unit controlled by said selection pulse processing circuit with an analog measurement signal generator and a bypass, said routing unit alternately puffing said analog measurement signal generator and said common measurement signal transducer into communication via said first link when said interface is selected and said bypass and said measurement signal transducer into communication via said first link when said interface is not selected, said bypass then assuring integral transmission of an analog measurement signal via said interface to said transducer when said signal is received from another interface upstream of said bypass on said first link relative to said transducer.

3. A measurement circuit as claimed in claim 2 wherein a second serial link transmits individual interface selection pulses transmitted by said common logic unit, said first and second links are respectively made up of elements inserted between two interfaces corresponding to two successive modules, and at least two interfaces corresponding to two successive modules are connected by two link elements, one of which is a first link element and the other of which is a second link element, each incorporating a protective diode connected in series to protect against reverse voltage, in particular in the event of a break in the electrical continuity between said modules to which said interfaces between which said diodes are connected correspond.

* * * * *